(12) United States Patent
Sano (10) Patent No.: US 8,714,296 B2
(45) Date of Patent: May 6, 2014

(54) VEHICLE INPUT DEVICE

(71) Applicant: Alps Electric Co., Ltd., Tokyo (JP)

(72) Inventor: Tadashi Sano, Tokyo (JP)

(73) Assignee: ALPS Electric Co., Ltd., Tokyo (JP)

( * ) Notice: Subject to any disclaimer, the term of this patent is extended or adjusted under 35 U.S.C. 154(b) by 0 days.

(21) Appl. No.: 13/670,896

(22) Filed: Nov. 7, 2012

(65) Prior Publication Data

US 2013/0112034 A1 May 9, 2013

(30) Foreign Application Priority Data

Nov. 7, 2011 (JP) ................................. 2011-243172

(51) Int. Cl.
*B60R 16/027* (2006.01)
*B60K 20/06* (2006.01)

(52) U.S. Cl.
CPC .............. *B60R 16/027* (2013.01); *B60K 20/06* (2013.01)
USPC .......................... 180/336; 74/484 R; 74/552

(58) Field of Classification Search
CPC ....... B60K 20/06; B60R 16/02; B60R 16/027
USPC ................ 180/336; 200/61.54, 61.56, 61.57; 74/473.3, 473.31, 473.1, 473.12, 74/473.19, 473.21, 473.35, 484 R, 552
See application file for complete search history.

(56) References Cited

U.S. PATENT DOCUMENTS

| | | | | |
|---|---|---|---|---|
| 5,365,803 A | * | 11/1994 | Kelley et al. ................. | 74/484 R |
| 5,949,149 A | * | 9/1999 | Shitanaka et al. ........... | 307/10.1 |
| 6,525,283 B2 | * | 2/2003 | Leng ............................. | 200/339 |
| 6,626,062 B1 | * | 9/2003 | Yoshitake et al. .............. | 74/552 |
| 7,703,570 B2 | * | 4/2010 | Ringger et al. ............... | 180/336 |
| 2002/0066658 A1 | * | 6/2002 | Agetsuma .................. | 200/61.54 |
| 2010/0200376 A1 | * | 8/2010 | Takahashi et al. ......... | 200/61.57 |

FOREIGN PATENT DOCUMENTS

JP 2007-012365 1/2007
JP 2009-255646 11/2009

* cited by examiner

*Primary Examiner* — James English
(74) *Attorney, Agent, or Firm* — Brinks Gilson & Lione (57) ABSTRACT

In a vehicle input device having a position detection portion configured to output a detection signal and a controller (control section) configured to receive the detection signal, the position detection portion operated by a driver is provided near an end side of the vehicle input device, and a contact operation surface on which the driver performs a contact operation is an end surface of an operation member of the position detection portion. Thus, the driver is capable of operating the vehicle input device with a finger while holding a steering wheel. In addition, by the controller determining the position of an operation of the driver on the basis of the detection signal from the position detection portion, it is made possible to detect various operations and various devices can be operated.

9 Claims, 11 Drawing Sheets

VEHICLE INPUT DEVICE

CLAIM OF PRIORITY

This application claims benefit of Japanese Patent Application No. 2011-243172 filed on Nov. 7, 2011, which is hereby incorporated by reference in its entirety.

BACKGROUND

1. Field of the Disclosure

The present disclosure relates to a vehicle input device which is mounted on a vehicle steering apparatus and serves to operate the headlight, the direction indicator, the transmission, the wiper, the air conditioner, the audio device, and the like of a vehicle.

2. Description of the Related Art

In a vehicle such as an automobile, the driver performs many device operations while steering the vehicle. These device operations include many operations required for safe driving, and, for example, lighting-up of a headlight due to sunset and an operation of a direction indicator prior to direction change are operations required for safe driving.

It is preferred that the driver be able to perform such an operation required for safe driving while performing a steering operation. It is desired that the driver be able to perform such an operation while holding the steering wheel. In addition, safer driving is possible if a transmission, a wiper, an air conditioner, and an audio device can be operated without releasing a hand from the steering wheel.

However, for example, with regard to a transmission, a shift lever for operating the transmission is provided in the vicinity of a center console next to the driver's seat, on a steering column, or the like. Thus, the driver cannot operate the shift lever unless releasing one hand from the steering wheel, and this may impede safe driving.

Meanwhile, in some luxury cars and sports type vehicles, a transmission operation mechanism called a paddle shift is provided as disclosed in Japanese Unexamined Patent Application Publication No. 2009-255646, and the driver is allowed to operate a transmission while holding a steering wheel which is a part of a steering apparatus.

Figure 10:
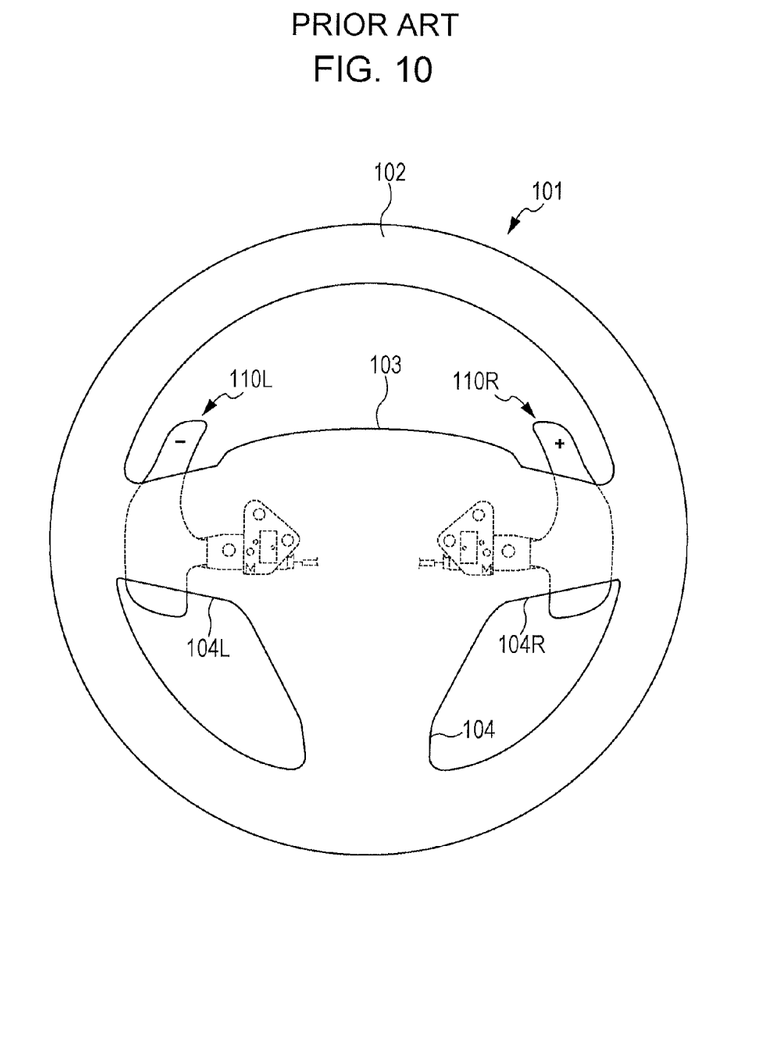
FIG. 10 is a diagram of existing paddle shifts disclosed in Japanese Unexamined Patent Application Publication No. 2009-255646.

In the transmission operation mechanism disclosed in Japanese Unexamined Patent Application Publication No. 2009-255646, as shown in FIG. 10, a pair of paddle shifts 110R and 110L are mounted on laterally-extending connection portions 104R and 104L of a steering wheel 101 which includes a ring portion 102, a center portion 103 in which a horn and the like are stored, and a connection portion 104.

The paired paddle shifts 110R and 110L allow the driver to operate the transmission while holding the steering wheel, the transmission shifts up by an operation of one of the paddle shifts, and the transmission shifts down by an operation of the other paddle shift.

However, what can be operated with the paddle shifts is only the transmission, and another operation mechanism needs to be provided in order to operate a device other than the transmission.

In general, devices, such as a headlight and a direction indicator, which cannot be operated with the paddle shifts, are operated with a pair of right and left combination switches, which are called stalk switches and fixed to the vehicle body side such as a steering column.

Figure 11:
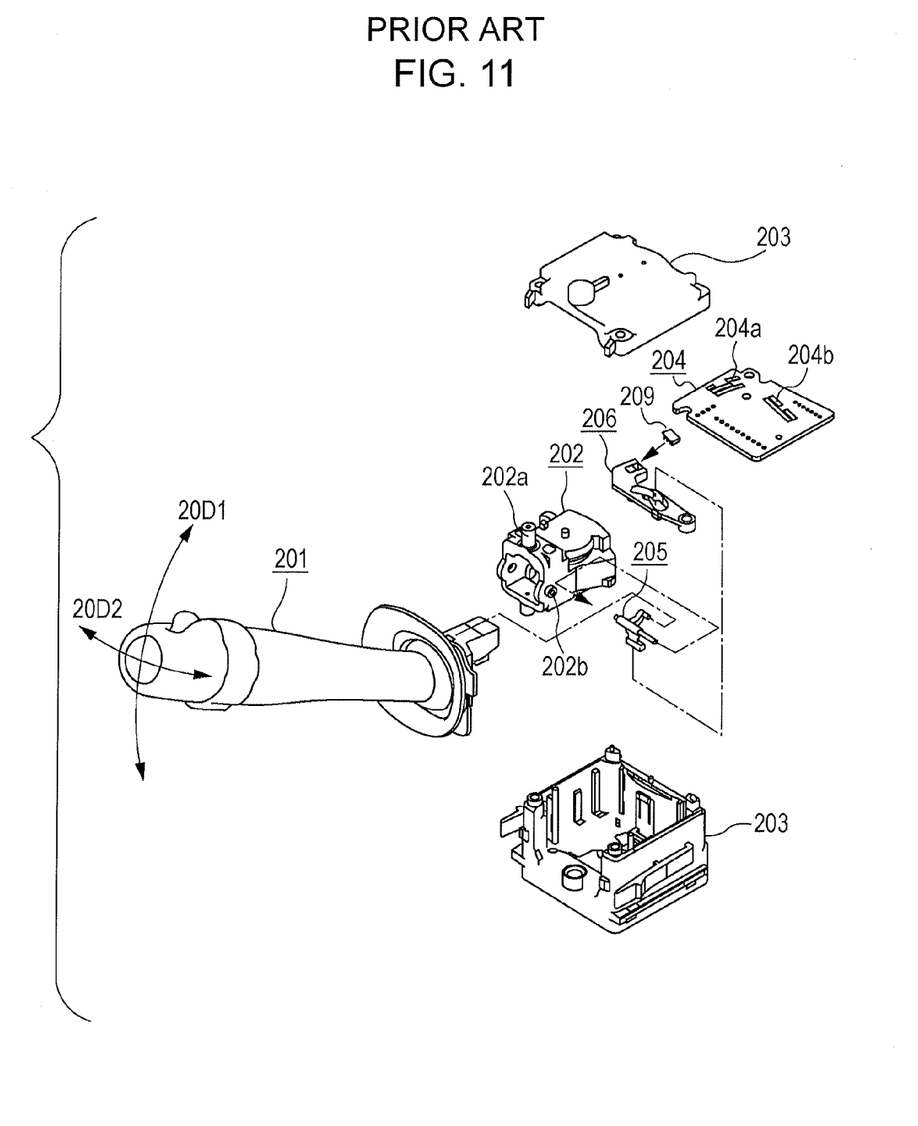
FIG. 11 is a diagram of an existing stalk switch disclosed in Japanese Unexamined Patent Application Publication No. 2007-12365.

Such an existing stalk switch is disclosed in Japanese Unexamined Patent Application Publication No. 2007-12365. As shown in FIG. 11, a rotation shaft (not shown) of an operation lever 201 is pivotally supported by a shaft support portion 202b of a holder 202, and a rotation shaft 202a of the holder 202 is pivotally supported by a housing 203. Thus, the operation lever 201 is allowed to be operated in a first operation direction 20D1 in which the operation lever 201 rotates about the shaft support portion 202b, and to be operated in a second operation direction 20D2 in which the operation lever 201 rotates about the rotation shaft 202a.

On a circuit board 204 retained on the bottom of the housing 203, contact patterns 204a and 204b are formed. When the operation lever 201 is operated in the first operation direction 20D1, a wiper 209 retained by a slider 206 which is connected to the operation lever 201 via a link driver 205 moves on the contact pattern 204a, and the operation of the first operation direction 20D1 is detected. In addition, when the operation lever 201 is operated in the second operation direction 20D2, a second wiper (not shown) mounted on a plurality of operating members (not shown) moves on the contact pattern 204b, and the operation of the second operation direction 20D2 is detected.

Thus, for example, when it is configured such that beam switching of the headlight is performed in the first operation direction 20D1 and the direction indicator is performed in the second operation direction 20D2, a beam switching operation and an operation of the direction indicator are allowed to be performed in a state where the hands are put on the steering wheel.

However, in order to allow many more operations, for example, operations such as turning on/off the headlight and switching the headlight to a small light, to be performed with an existing stalk switch, countermeasure such as adding a rotary switch to an end of the operation lever needs to be taken. Such an added switch cannot be operated unless a hand is released from the steering wheel, and this may impede safe driving.

The present invention has been made in view of the circumstances described above, and the present invention provides a vehicle input device which allows various devices to be operated while a steering wheel is held.

SUMMARY

According to a first aspect of the present invention, a vehicle input device includes: a mounted portion mounted on a steering apparatus having a steering wheel and a steering column; an operation input portion provided so as to project from the mounted portion in a direction away from a rotation central axis of the steering wheel and configured to detect an operation of a driver and generate a detection signal; and a control section configured to receive the detection signal. The operation input portion has a position detection portion configured to detect a position of an operation with a finger of the driver and a retaining member configured to retain the position detection portion. The position detection portion is provided on a projecting direction end side of the operation input portion. The detection signal is generated on the basis of the position of the operation with the finger of the driver.

DESCRIPTION OF THE EXEMPLARY EMBODIMENTS

Hereinafter, a vehicle input device according to an embodiment of the present invention will be described with reference to FIGS. 1A to 3.

Figure 1A:
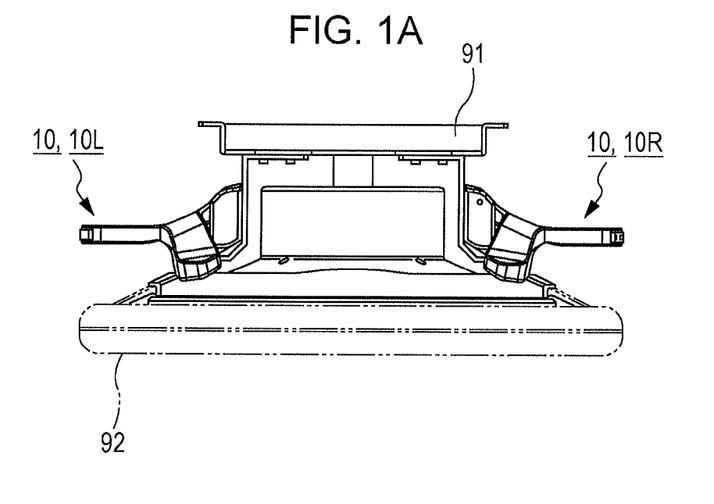
FIGS. 1A and 1B are diagrams illustrating a state where a vehicle input device according to an embodiment of the present invention is mounted on a steering apparatus and are a top view and a front view.
Figure 1B:
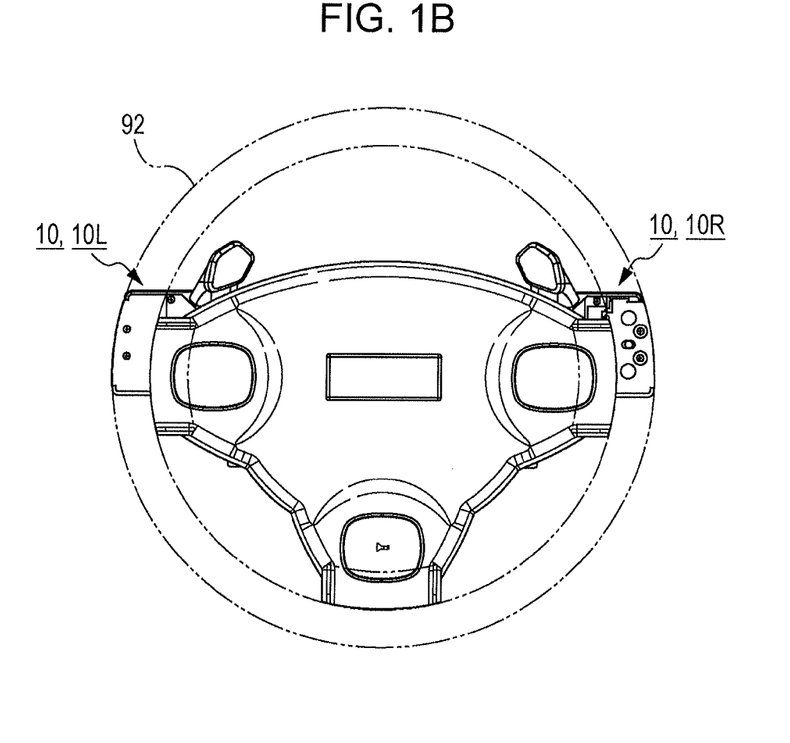
Figure 2A:
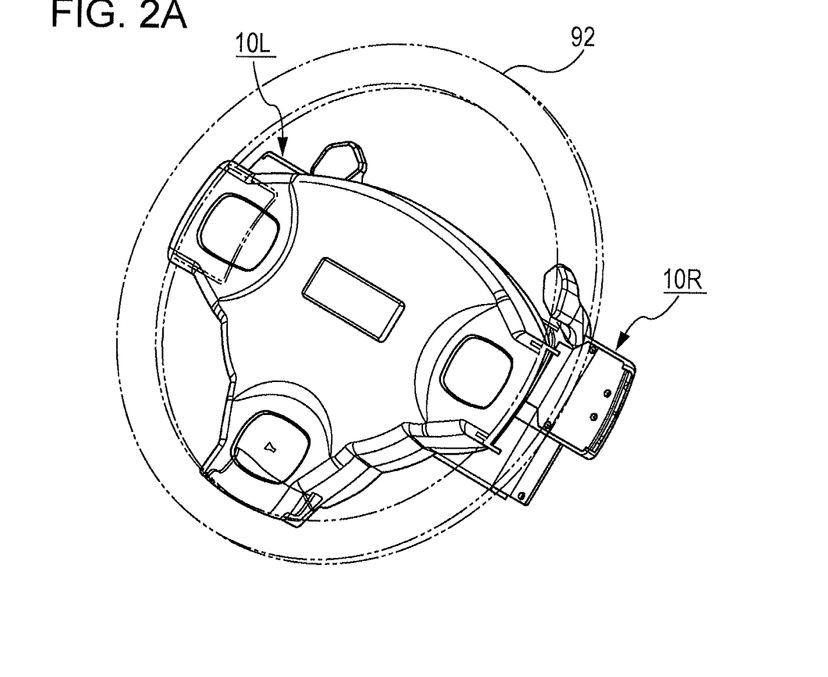
FIGS. 2A and 2B are diagrams illustrating the vehicle input device according to the embodiment of the present invention and are an external perspective view of the steering apparatus and an external perspective view of the vehicle input device.
Figure 2B:
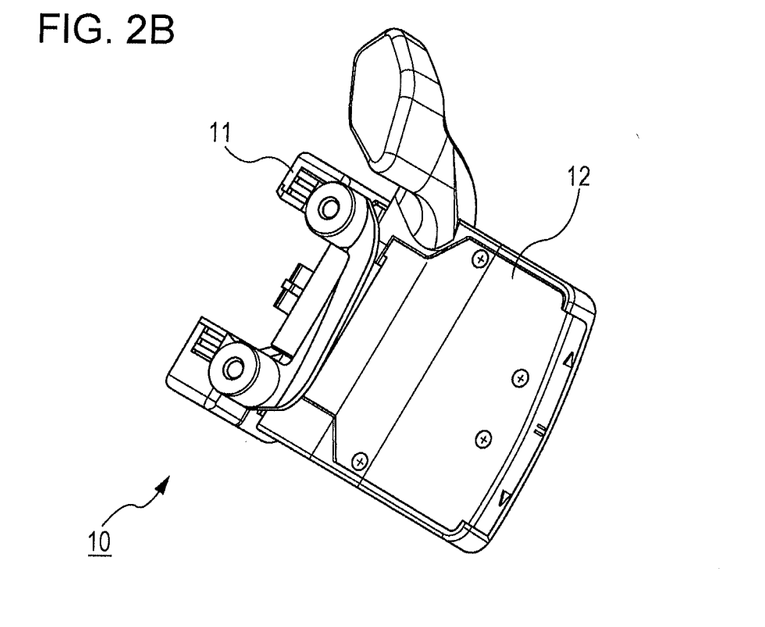
Figure 3:
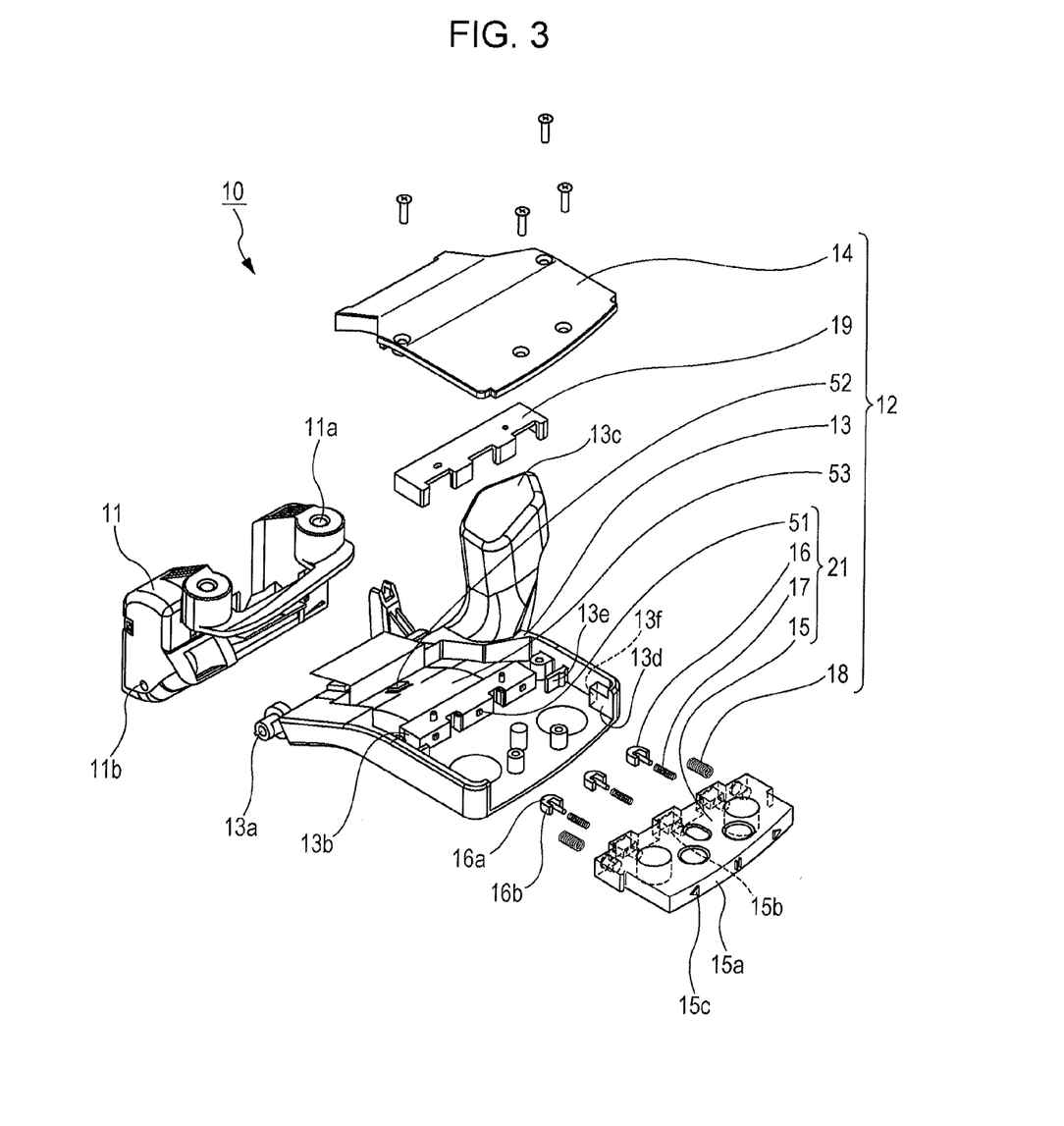
FIG. 3 is an exploded perspective view of the vehicle input device according to the embodiment of the present invention.

FIGS. 1A and 1B are diagrams illustrating a state where illustrating a state where the vehicle input device according to the embodiment of the present invention is mounted on a steering apparatus, FIG. 1A is a top view, and FIG. 1B is a front view. FIGS. 2A and 2B are diagrams illustrating the vehicle input device according to the embodiment of the present invention. FIG. 2A is an external perspective view of the steering apparatus, and FIG. 2B is an external perspective view of the vehicle input device. FIG. 3 is an exploded perspective view of the vehicle input device according to the embodiment.

As shown in FIGS. 1A and 1B, a steering apparatus of a vehicle includes a steering column 91 fixed to a vehicle body and a steering wheel 92 retained rotatably by the steering column 91. The vehicle input device according to the embodiment of the present invention can be mounted on any of the steering column 91 or the steering wheel 92. In the following embodiment, the case where the vehicle input device 10 is mounted on the steering column 91 will be described.

In the vehicle input device according to the embodiment of the present invention, a pair of right and left vehicle input devices 10R and 10L are mounted on the steering column 91. The paired right and left vehicle input devices 10R and 10L are symmetrical to each other in shape and are mounted at positions farther from the driver than the steering wheel 92 so as to be substantially symmetrical to each other about a vertical line passing through the rotation center of the steering wheel 92, as shown in FIG. 2A.

As shown in FIG. 2B, the vehicle input device 10 includes a mounted portion 11 mounted on the steering column 91 and an operation input portion 12 projecting from the mounted portion 11 in a direction away from the rotation central axis of the steering wheel 92. The operation input portion 12 detects the position of an operation of the driver.

Hereinafter, the vehicle input device 10 according to the present embodiment will be described with reference to FIG. 3. The right-side vehicle input device 10R mounted on the right side of the steering column 91 will be described below. However, since the left-side vehicle input device 10L is the same as the vehicle input device 10R, except that their shapes and configurations are symmetrical, the description of the left-side vehicle input device 10L is omitted. Hereinafter, the right-side vehicle input device 10R is described merely as the vehicle input device 10.

The mounted portion 11 is formed from a molded material or the like and has a mounting hole 11a for mounting the vehicle input device 10 on the steering column 91 and a through hole 11b for pivotally supporting the operation input portion 12.

The operation input portion 12 includes a position detection portion 21, a casing (retaining member) 13, a cover 14, operation member retaining springs (elastic members) 18, an FPC holder 19, a controller (control section) 52, an FPC 53, and a plurality of assembling screws. The position detection portion 21 includes an operation member 15, pressing members 16, pressing springs 17, and force sensors (sensor elements) 51.

The casing 13 is formed from a molded material in a substantially box shape whose upper portion is opened, has, at one end portion, an opened open end 13d through which the operation member 15 is inserted, and has, at the other end portion on the side opposite to the open end 13d, a mounting hole 13a which is combined with the through hole 11b of the mounted portion 11 to allow the operation input portion 12 to be rotatably supported by the mounted portion 11. The casing 13 has, at the substantially center of a bottom portion, a base portion 13b by which a portion of the FPC 53 on which the force sensors 51 are mounted is retained, and has, at an intermediate portion near the open end 13d, spring receiving portions 13e which engage the operation member retaining springs 18. In addition, the casing 13 has, on one side of a portion near the other end, an arm-shaped paddle portion 13c extending obliquely upward.

The cover 14 is formed from a molded material or the like in a substantially plate shape and mounted on the opened upper portion of the casing 13.

The operation member 15 is formed from a molded material or the like in a substantially plate shape, one side surface thereof is an operation surface 15a exposed in the opened open end 13d of the casing 13, and the other side surface thereof has a plurality of pressing member retaining holes 15b which slidably retain the pressing members 16 via the pressing springs 17. In addition, the operation surface 15a on the pressing direction near side of the operation member 15 is provided with projection shapes 15c, which are recognizable with a finger of the driver.

Each pressing member 16 is formed from a molded material or the like, has a semicircular column-shaped pressing portion 16a which presses the force sensor 51, and has, at the other end surface, a column portion 16b which retains the pressing spring 17.

Each pressing spring 17 is a compression spring formed from spring stainless steel in a coil shape and is inserted in the pressing member retaining hole 15b of the operation member 15 together with the pressing member 16.

Each force sensor 51 is a substantially rectangular sensor and outputs a detection signal corresponding to a pressing force generated when the upper surface thereof is pressed.

The controller 52 receives a detection signal from each force sensor 51 and determines an operation motion of the driver by combining detection signals from a plurality of the force sensors 51.

In the FPC 53, a conductive wiring of copper or the like is formed on a flexible film, and the three force sensors 51 and the controller 52 are mounted. The force sensors 51 are mounted at three positions which face the substantially center of the range of the operation surface 15a of the operation member 15 and the vicinities of both ends of the range of the operation surface 15a.

The FPC holder 19 is formed from a molded material or the like and presses the FPC 53 disposed on the base portion 13b of the casing 13. In such a case, cuts are formed in the FPC holder 19 such that the force sensors 51 are exposed.

Each operation member retaining spring 18 is a compression spring formed from spring stainless steel in a coil shape and urges the operation member 15 in a direction protruding from the open end 13d of the casing 13.

Figure 4A:
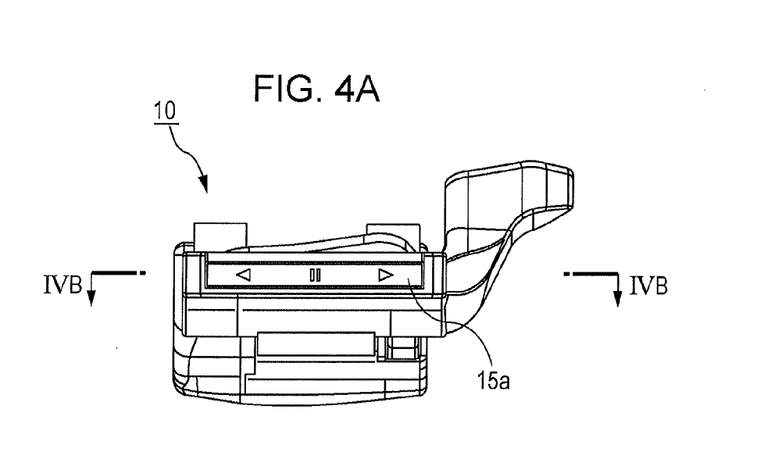
FIGS. 4A and 4B are diagrams illustrating the vehicle input device according to the embodiment and are an external view as seen from an operation surface side and a cross-sectional view taken along the line IVB-IVB in FIG. 4A.
Figure 4B:
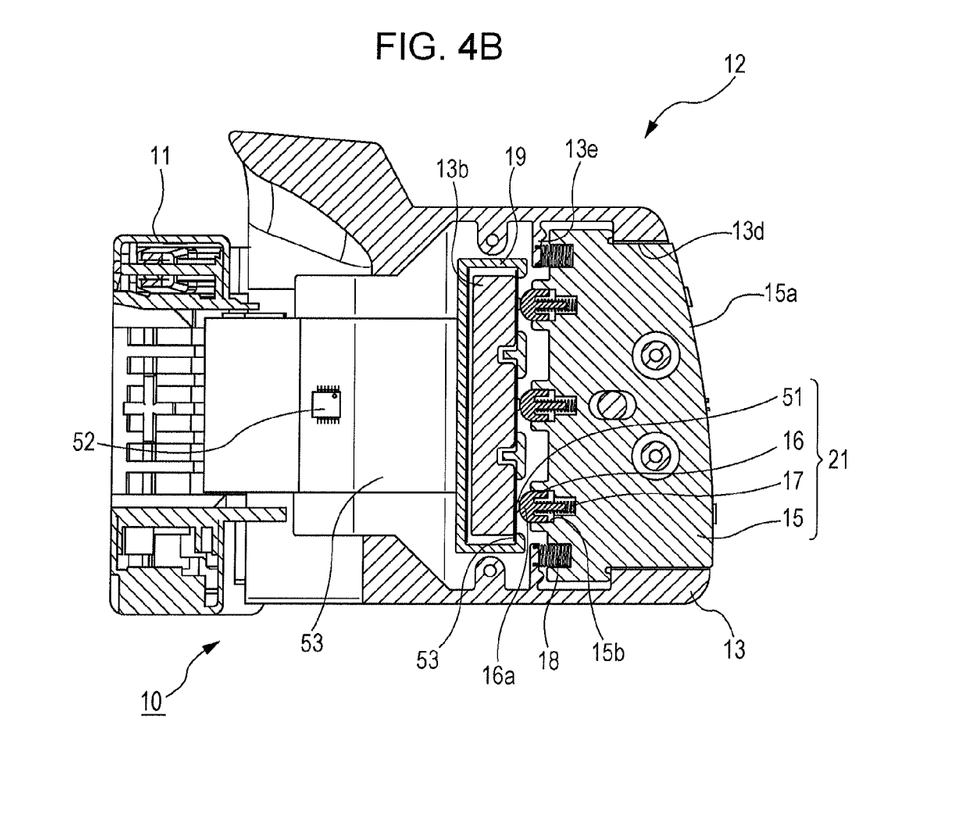

Next, an assembly structure of the vehicle input device according to the present embodiment and an operation position detection operation performed when the driver operates the vehicle input device 10 with a finger will be described with reference to FIGS. 4A and 4B. FIGS. 4A and 4B are diagrams illustrating the vehicle input device according to the present embodiment. FIG. 4A is an external view of the vehicle input device 10 as seen from the operation surface 15a side, and FIG. 4B is a cross-sectional view taken along the line IVB-IVB in FIG. 4A.

As shown in FIG. 4B, the vehicle input device 10 includes the mounted portion 11 and the operation input portion 12, and the operation input portion 12 has the position detection portion 21, which detects the position of an operation performed with a finger of the driver. The position detection portion 21 includes the operation member 15, the pressing members 16, the pressing springs 17, and the force sensors 51. The operation member 15 is elastically retained by the casing 13 via the operation member retaining springs (elastic members) 18, and each force sensor 51 is retained by the base portion 13b of the casing 13 via the FPC 53. In addition, the pressing springs 17 and the pressing members 16 are inserted in the three pressing member retaining holes 15b of the operation member 15, and the pressing portions 16a at the ends of a plurality of the pressing members 16 are in contact with the upper surfaces of a plurality of the force sensors 51 of the position detection portion 21.

The operation member 15 is urged by the operation member retaining springs 18 in the direction protruding from the end of the casing 13. The operation member 15 is stopped by a portion of the operation member 15 coming into contact with an inner wall 13f of the casing 13, and the operation surface 15a of the operation member 15 slightly protrudes from the open end 13d of the casing 13.

When the driver operates the operation surface 15a of the operation member 15 with a finger, the operation member retaining springs 18 are bent by a pressing force generated by the operation with the finger and the operation member 15 is displaced in the pressing direction. Thus, the driver can obtain an operation feel and hence the operability is improved.

In addition, the pressing force generated by the operation with the finger urges the pressing members 16 via the pressing springs 17 in the pressing direction, and a pressing force with which the pressing portion 16a of each pressing member 16 presses the force sensor 51 changes. The force sensor 51 outputs a detection signal corresponding to the pressing force. Thus, when the pressing force with which each pressing member 16 presses the force sensor 51 changes, the detection signal of the force sensor 51 also changes.

In the vehicle input device 10 according to the embodiment of the present invention, the three force sensor 51 are disposed at three locations which face the substantially center of the range of the operation surface 15a and the vicinities of both ends of the range of the operation surface 15a. When the driver operates the operation surface 15a of the operation member 15, the force sensor 51 located near the position of the operation receives a great pressing force, and the force sensor 51 located at a position away from the contact position receives only a small pressing force. For example, when the driver operates one end side of the operation surface 15a, a great pressing pressure is applied to the force sensor 51 located at a position which faces the one end side of the operation surface 15a, but only a small pressing pressure is applied to the force sensor 51 located at a position which faces the other end side of the operation surface 15a.

Each force sensor 51 outputs a detection signal corresponding to a pressing force. Thus, a difference is produced between a plurality of detection signals from a plurality of the force sensors 51 of the position detection portion 21 by the position of an operation. The detection signals outputted from a plurality of the force sensors 51 of the position detection portion 21 are inputted into the controller 52, and the controller 52 is allowed to detect the position of an operation from changes of a plurality of the detection signals.

Next, detection of the motion of an operation of the driver in the vehicle input device according to the present embodiment will be described with reference to FIG. 5.

Figure 5:
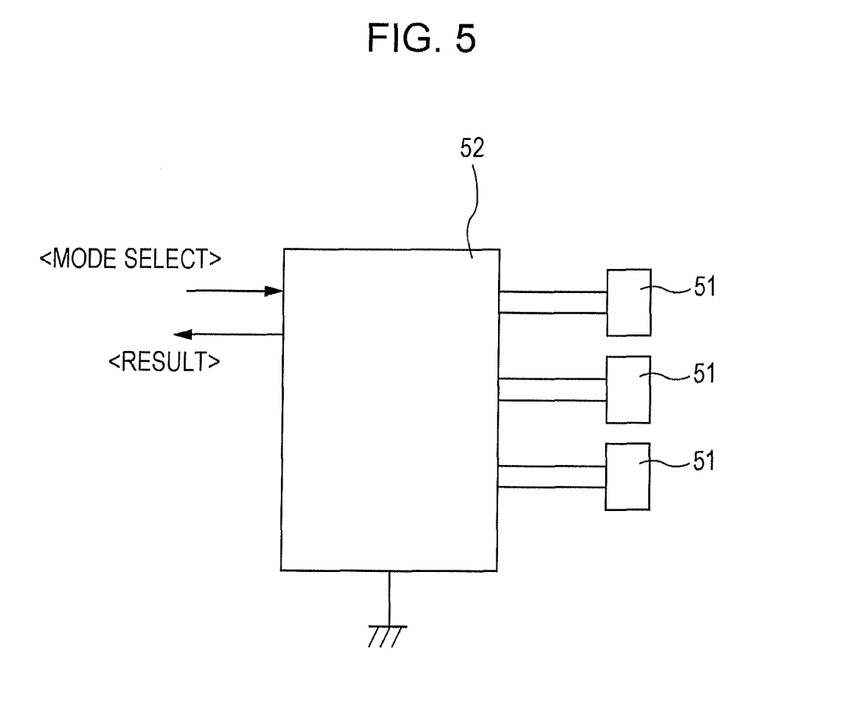
FIG. 5 is a block diagram illustrating an electrical connection state of a controller and a plurality of force sensors in the embodiment.

FIG. 5 is a block diagram illustrating an electrical connection state of the controller and a plurality of the force sensors.

In the case where a plurality of the force sensors 51 of the vehicle input device 10 according to the present embodiment are arranged, for example, in the vertical direction as seen from the driver, when the driver operates the operation surface 15a with a finger from up to down, the detection signal of the upper force sensor 51 initially largely changes, then the detection signal of the middle force sensor 51 largely changes, and the detection signal of the lower force sensor 51 finally largely changes.

As shown in FIG. 5, a plurality of the detection signals of a plurality of the force sensors 51 of the position detection portion 21 are inputted into the controller 52, and the controller 52 continuously monitors a plurality of the detection signals. Therefore, the controller 52 is allowed to detect an operation motion of the driver from timings of changes of a plurality of the detection signals.

For example, when the detection signal of the upper force sensor 51 initially largely changes, then the detection signal of the middle force sensor 51 largely changes, and the detection signal of the lower force sensor 51 finally largely changes as described above, the controller 52 detects that the operation surface 15a is continuously operated from up to down and determines that the driver has performed an operation motion in the vertical direction.

As described above, in the vehicle input device 10 according to the present embodiment, when the driver operates the operation surface 15a of the operation member 15 of the position detection portion 21 which is exposed in the open end 13d (projecting direction end side surface) of the operation input portion 12, the detection signals of a plurality of the force sensors 51 of the position detection portion 21 which are inputted into the controller 52 change, and the controller (control section) 52 can detect the operation. Furthermore, the controller 52 can determine an operation motion of the driver from timings of changes of a plurality of the detection signals.

In the vehicle input device 10 according to the present embodiment, the position and the operation motion of an operation can be detected. Thus, for example, in an operation mode of direction indicator, when one end side of the operation surface 15a is operated, a direction indicator on one side is flickered, and when the other end side of the operation surface 15a is operated, a direction indicator on the other side is flickered. An operation is also possible in which when the operation surface 15a is continuously operated from one end side to the other end side, a plurality of direction indicators provided on the other side are flicked in order of arrangement.

An operation of a device with such a continuous operation motion is applicable to operations of various devices other than the direction indicators. For example, in an operation mode of wiper, a device operation such as for changing the speed of an intermittent motion with a continuous operation motion is made possible.

Furthermore, in the vehicle input device 10 according to the present embodiment, the sensor elements (force sensors) each of which outputs a detection signal corresponding to a pressing force generated by an operation with a finger of the driver are used. Thus, when the position detection portion 21 outputs a plurality of detection signals corresponding to a great pressing force, it is also possible to detect an operation motion for making a flickering interval very short, for example, in the operation mode of direction indicator.

Detection of various operation motions as described above can be freely changed by setting of determination conditions of the controller 52.

In accordance with an operation mode (e.g., the operation mode of direction indicator) designated by a control device on the vehicle body side, the controller 52 outputs a control signal corresponding to the operation mode (e.g., a signal for lighting up a plurality of direction indicators in order of arrangement), on the basis of a result of detection of an operation motion of the driver. Therefore, when a plurality of devices are operated, types of operation motions to be detected can be changed for each operation target device or for each vehicle type.

Thus, the vehicle input device 10 according to the embodiment of the present invention allows various devices to be operated.

In the present embodiment, the case has been described above where the controller 52 detects a continuous operation on the basis of the difference in timing between a plurality of detection signals. However, it should be understood that a portion of the operation surface can be merely pressed to allow a device corresponding to the pressed position to be operated.

Figure 6A:
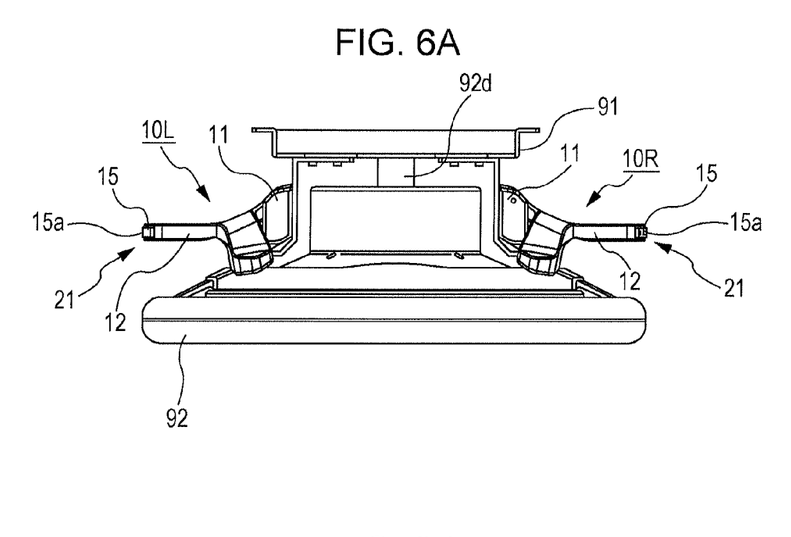
FIGS. 6A and 6B are diagrams illustrating a state where the vehicle input device according to the embodiment of the present invention is mounted on the steering apparatus and are a top view and a front view.
Figure 6B:
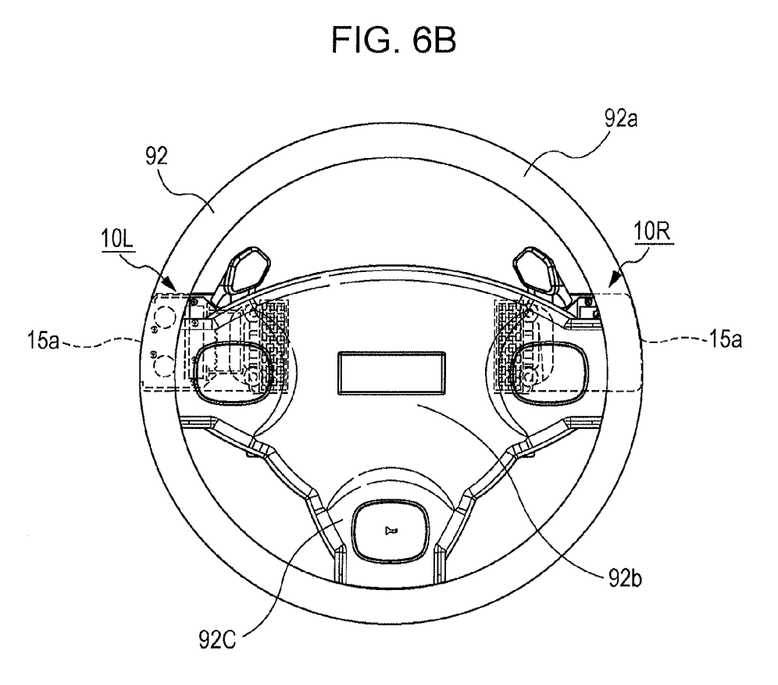

Next, a situation of an operation performed by the driver in the case where the vehicle input device 10 according to the present embodiment is mounted on a steering apparatus will be described.

FIGS. 6A and 6B are diagrams illustrating a state where the vehicle input device according to the embodiment of the present invention is mounted on the steering apparatus and, FIG. 6A is a top view, and FIG. 6B is a front view.

As shown in FIG. 6A, in each of the right-side vehicle input device 10R and the left-side vehicle input device 10L, a portion operated by the driver is the operation surface 15a of the operation member 15 of the position detection portion 21 which is provided in the mounted portion 11 so as to extend in the direction away from the steering column 91 and exposed in the projecting direction end side surface of the operation input portion 12.

The driver steers the vehicle while holding the steering wheel 92 of the steering apparatus on which the mounted portion 11 of the vehicle input device 10 according to the embodiment of the present invention is mounted. The operation surface 15a of the operation input portion 12 is provided so as to extend in the direction away from the steering column 91, and thus the driver can touch the vehicle input device 10 by extending a finger while holding the steering wheel 92.

In addition, the operation surface 15a of the operation member 15 in the end surface of the position detection portion 21 in the projecting direction, which is the operation surface 15a of the vehicle input device 10, is shaped along a ring portion 92a of the steering wheel 92 of the steering apparatus on which the mounted portion 11 is mounted, as shown in FIG. 6B. Thus, the driver can operate the vehicle input device 10 by merely slightly shifting a hand on the steering wheel 92 while holding the steering wheel 92.

Due to the above, in the vehicle input device 10 according to the embodiment of the present invention, the driver can operate the vehicle input device 10 while holding the steering wheel. Thus, the driver can operate various devices while holding the steering wheel, and a vehicle input device having favorable operability can be provided.

Figure 7:
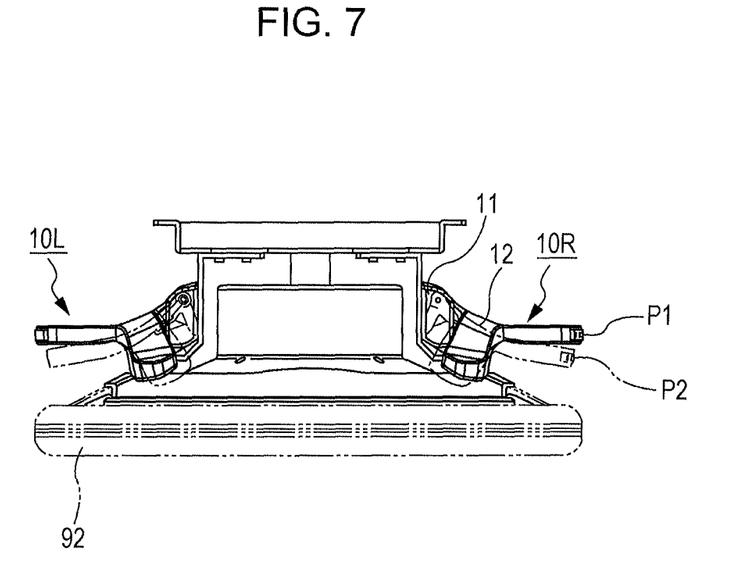
FIG. 7 is a top view of the steering apparatus for illustrating a tilt operation of an operation input portion of the vehicle input device according to the embodiment.

Next, an operation for controlling a transmission of the vehicle by a tilt operation of the operation input portion 12 of the vehicle input device 10 according to the present embodiment will be described.

FIG. 7 is a top view of the steering apparatus illustrating a tilt operation of the operation input portion of the vehicle input device according to the embodiment of the present invention.

In the vehicle input device 10 according to the embodiment of the present invention, the operation input portion 12 is rotatably retained by the mounted portion 11. As shown in FIG. 7, the operation input portion 12 is tiltable from a non-operation position P1, to which the operation input portion 12 automatically returns during non-operation, to an operation position P2 which is on either the near side or the far side of the driver (FIG. 7 illustrates the case of the near side).

The vehicle input device 10 includes a return spring (not shown) for returning the operation input portion 12 to the non-operation position P1 and a detection switch (no shown), and the detection switch detects that the operation input portion 12 is tilted to the operation position P2.

In the vehicle input device 10 according to the embodiment of the present invention, for example, when it is detected that the operation input portion 12 of the right-side vehicle input device 10R has moved to the operation position P2 through a detection result of the detection switch, a signal for shifting up the transmission of the vehicle is generated, and when it is detected that the operation input portion 12 of the left-side vehicle input device 10L has moved to the operation position P2 through a detection result of the detection switch, a signal for shifting down the transmission of the vehicle is generated. Due to the above, the vehicle input device 10 according to the embodiment of the present invention can be used as a paddle shift which shifts up or down the transmission of the vehicle.

At that time, an operation of the vehicle input device 10 is in a direction toward the rotation central axis of the steering wheel 92, the operating direction of the paddle shift is the direction along the rotation central axis of the steering wheel 92, and thus the operating direction of the vehicle input device 10 and the paddle shift operating direction are orthogonal to each other. Thus, even when a paddle shift function is provided in the vehicle input device 10, an operation of the vehicle input device 10 is not impaired.

In the embodiment described above, the detection switch detects that the operation input portion 12 is tilted to the operation position P2. However, the detection switch may be configured to detect that the operation input portion 12 is at the non-operation position P1 or both the non-operation position P1 and the operation position P2.

In the above-described vehicle input device 10 according to the embodiment of the present invention, the force sensors are used as detection elements. However, any sensors can be used as detection elements as long as they can detect a finger of the driver. For example, a similar vehicle input device can be configured with strain resistance elements, electrostatic sensors, or the like.

In addition, in the vehicle input device 10 according to the embodiment of the present invention, the number of the detection elements is three. However, the number of the detection elements may be freely increased or decreased according to need.

In addition, in the vehicle input device 10 according to the embodiment of the present invention, the projection shapes, through which an operation position is recognizable with a finger, are provided on the operation surface. However, a recess shape or any shape may be provided as long as it is such a shape that an operation position is recognizable with a finger and visual recognition is not necessary.

In addition, the vehicle input device 10 according to the embodiment of the present invention is structured to be mounted on the steering column 91, but may be mounted on the steering wheel 92, not on the steering column 91. Alternatively, only the operation input portion 12 may be taken out and mounted on the steering column 91 or the steering wheel 92. Still alternatively, only the position detection portion 21 may be taken out and mounted on the steering column 91 or the steering wheel 92.

In addition, in the vehicle input device 10 according to the embodiment of the present invention, the controller (control section) 52 is mounted on the FPC 53. However, a controller may be provided outside the operation input portion 12. Alternatively, a controller may be provided outside the vehicle input device 10.

In addition, in the vehicle input device 10 according to the embodiment of the present invention, in accordance with the designated operation mode, the controller (control section) 52 outputs a control signal corresponding to the operation mode, on the basis of a result of detection of an operation motion of the driver. However, the controller 52 may output detection signals outputted from a plurality of the force sensors 51 of the position detection portion 21, and a control signal corresponding to the operation mode may be generated by a control device on the vehicle body side.

In addition, in the vehicle input device 10 according to the embodiment of the present invention, the right-side vehicle input device 10R and the left-side vehicle input device 10L are the same except that their shapes and configurations are symmetrical. However, a different feature may be provided to the right-side vehicle input device 10R and the left-side vehicle input device 10L.

For example, the number of the detection elements in the right-side vehicle input device 10R can be made different from that in the left-side vehicle input device 10L. The function of the control section in the right-side vehicle input device 10R can be made different from that in the left-side vehicle input device 10L, and, for example, the left-side vehicle input device 10L can be used for selecting an operation mode and the right-side vehicle input device 10R can be used for operating a selected device.

First Modification of Embodiment

Next, a first modification of the embodiment of the present invention will be described with reference to FIGS. 8A and 8B.

Figure 8A:
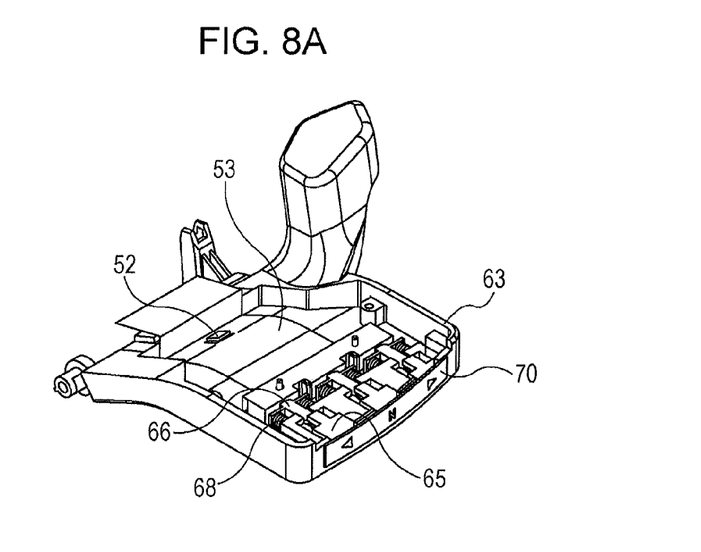
FIGS. 8A and 8B are diagrams of a vehicle input device according to a first modification of the embodiment of the present invention and are an external perspective view and a relevant portion cross-sectional view.
Figure 8B:
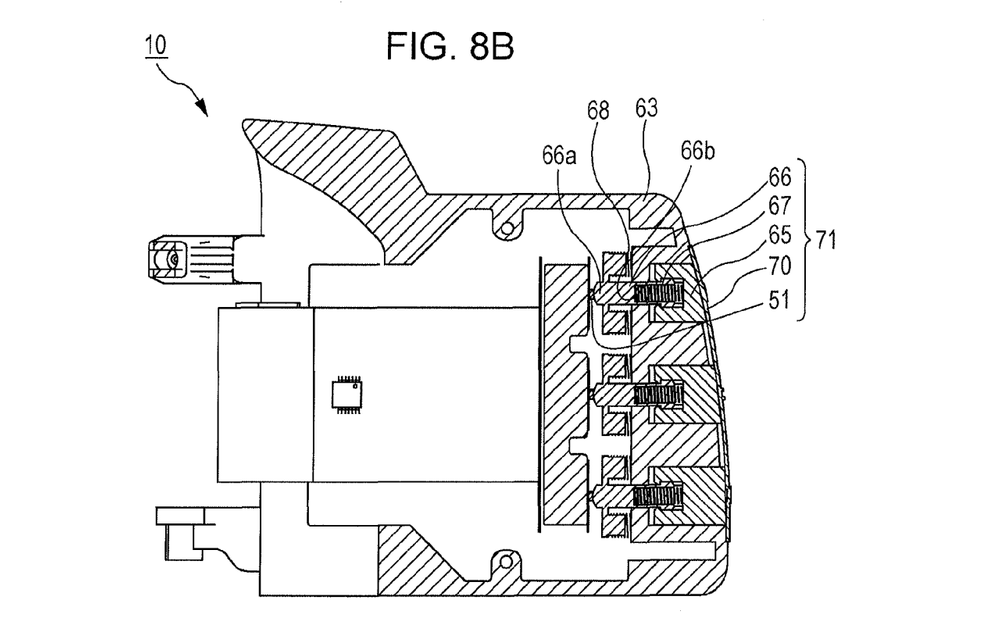

FIGS. 8A and 8B are diagrams of a vehicle input device according to the first modification of the embodiment of the present invention, FIG. 8A is an external perspective view, and FIG. 8B is a cross-sectional view at a position corresponding to the line IVB-IVB in FIG. 4A. In FIG. 8A, illustration of a cover is omitted for easy understanding. In addition, the same components as those in the embodiment are designated by the same reference signs, and the detailed description thereof is omitted.

In the vehicle input device 10 according to the first modification of the embodiment of the present invention, a position detection portion 71 includes operation members 65, pressing members 66, pressing springs 67, a contact plate 70, and force sensors (sensor elements) 51.

In each pressing member 66, one end is a semicircular-column-shaped pressing portion 66a which presses the force sensor 51, arm portions laterally project from the vicinity of the one end, and another end has a hole for retaining the pressing spring 67.

In each operation member 65, one end has a recess 66b for retaining the pressing spring 67 as well as the pressing member 66, and another end is a curved surface which is in contact with the contact plate 70.

The contact plate 70 is a curved, plate-shaped member having flexibility, is in contact at one surface side with the other ends of a plurality of the operation members 65, and is provided on the other surface side with projection shapes which the driver can recognize with a finger.

Each pressing member 66 and each pressing spring 67 are inserted in the recess of the operation member 65, and the pressing member 66 and the operation member 65 are urged by the pressing spring 67 in a direction in which the pressing member 66 and the operation member 65 are separated from each other, but are stopped by engagement between a projection shape of the pressing member 66 and a projection shape of the operation member 65.

Each pressing member 66 is slidably retained by an inner wall of a casing (retaining member) 63 and urged by compression springs 68 in a direction toward the force sensor 51. Thus, the pressing portion 66a of the pressing member 66 is pressed by an upper surface of the force sensor 51.

The contact plate 70 is retained at both ends of the one surface side by the casing 63 and is in contact at an intermediate portion with the other ends of a plurality of the operation members 65. In addition, there are gaps between the casing 63 and intermediate portions between a plurality of portions that are in contact with a plurality of the operation members 65.

When the driver operates the contact plate 70, the contact plate 70 elastically deforms due to pressing, the pressing force is transmitted from the operation members 65 to the pressing springs 67, the pressing springs 67 further press the pressing members 66 in the direction toward the force sensors 51, and detection signals of the force sensors 51 change. Thus, the operation of the driver can be determined.

When the driver operates the intermediate portion of each of a plurality of the operation members 65, the contact plate 70 elastically deforms due to pressing by the operation, the force sensor 51 near the operation position receives a great pressing force, and the force sensor 51 away from the operation position receives a small pressing force. Therefore, the operation position can be determined on the basis of the detection signals of a plurality of the force sensors 51, and the operation motion of the driver can be determined from timings of the detection signals of a plurality of the force sensors 51.

In the first modification of the embodiment of the present invention, a pressing force caused by the operation of the driver is applied to a plurality of the force sensors 51 via the operation members 65, the pressing springs 67, and the pressing members 66, and thus high-sensitivity detection is possible.

In addition, by setting the strength of each pressing spring 67 to such strength that the pressing spring 67 deforms by a pressing force equal to or smaller than a force by which the force sensor 51 is broken, the pressing spring 67 does not almost bend with a normal operation and a pressing force applied to the operation member 65 is applied to the pressing member 66. However, when an the contact plate 70 is pressed with an excessive pressing force due to an abnormal operation, the pressing spring 67 bends and a force caused by deformation of the pressing spring 67 is applied to the pressing member 66. Thus, application of an excessive pressing force to the force sensor 51 can be avoided, and a highly-reliable vehicle input device can be provided in which sensor elements are not broken even when an abnormal operation is performed.

In the first modification of the embodiment of the present invention, the structure is provided in which each pressing member 66 is urged by the compression springs 68 in the direction toward the force sensor 51. However, an engagement structure which prevents each pressing member 66 from moving out through an end surface of the casing 63 may be provided and the compression springs 63 may be omitted.

In addition, in the first modification of the embodiment of the present invention, the structure is provided in which a pressing force caused by an operation is applied from the operation members 65 via the pressing springs 67 to the pressing members 66. However, countermeasure such as providing an excessive pressing force avoiding structure on the back surface of each force sensor 51 may be taken, and a structure may be provided in which operation pressure is applied directly to each pressing member 66.

Second Modification of Embodiment

Next, a second modification of the embodiment of the present invention will be described with reference to FIGS. 9A and 9B.

Figure 9A:
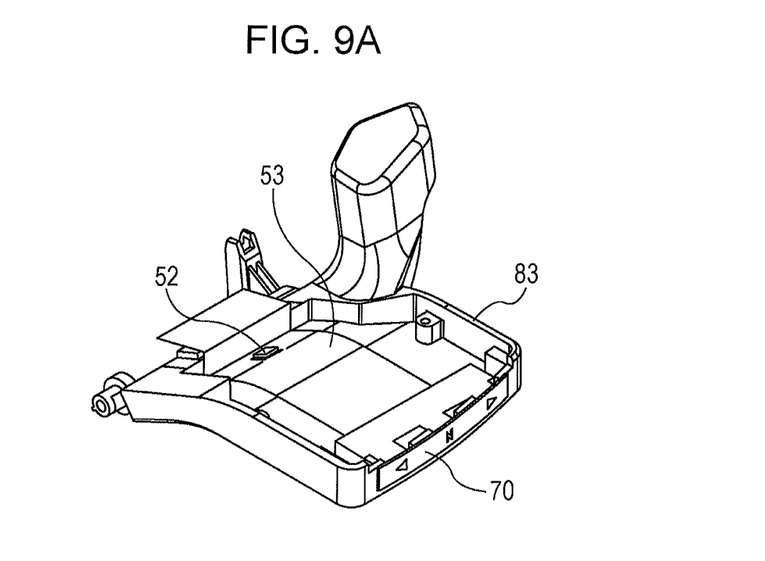
FIGS. 9A and 9B are diagrams of a vehicle input device according to a second modification of the embodiment of the present invention and are an external perspective view and a relevant portion cross-sectional view.
Figure 9B:
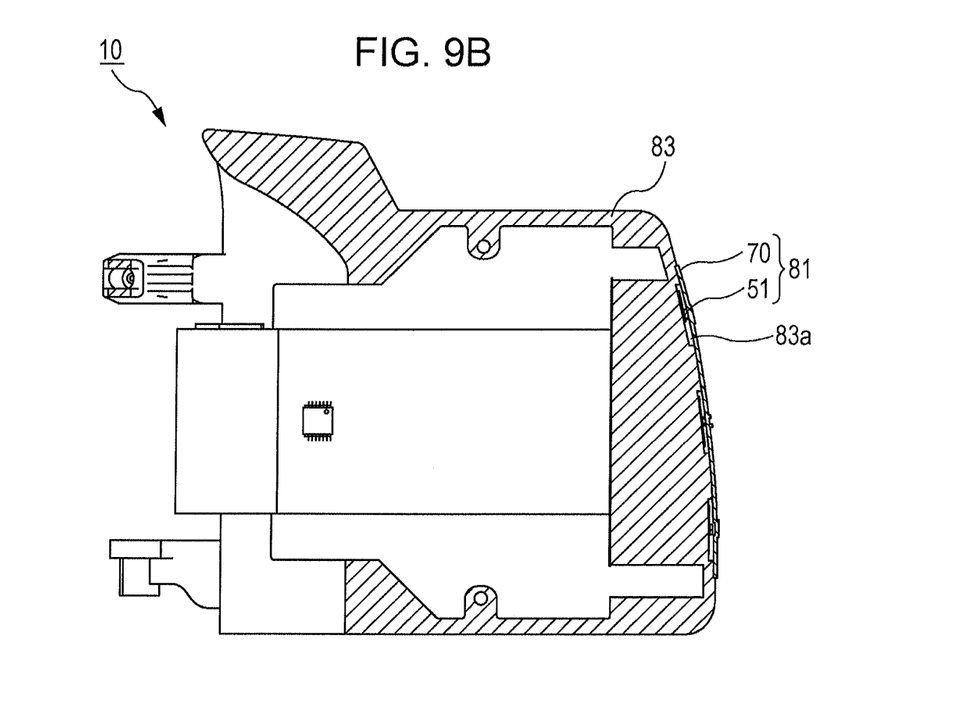

FIGS. 9A and 9B are diagrams of a vehicle input device according to the second modification of the embodiment of the present invention, FIG. 9A is an external perspective view, and FIG. 9B is a cross-sectional view at a position corresponding to the line IVB-IVB in FIG. 4A. In FIG. 9A, illustration of a cover is omitted for easy understanding. In addition, the same components as those in the embodiment and the first modification are designated by the same reference signs, and the detailed description thereof is omitted.

In the vehicle input device 10 according to the second modification of the embodiment of the present invention, a position detection portion 81 includes a contact plate 70 and force sensor (sensor elements) 51.

A casing (retaining member) 83 is formed from a molded material in a substantially box shape whose upper portion is opened, and has, at one end, a plurality of recesses 83a in which a plurality of the force sensors (sensor elements) 51 are inserted.

A plurality of the force sensors 51 are mounted on an FPC 53 and retained by a plurality of the recesses 83a of the casing 83 via the FPC 53, and the upper surface of each force sensor 51 is in contact with one surface side of the contact plate 70.

In the vehicle input device 10 according to the second modification of the embodiment of the present invention, when the driver operates the contact plate 70, a pressing force caused by the operation presses the force sensors 51 via the contact plate 70, and detection signals of the force sensors 51 change. Thus, the operation of the driver can be detected.

In the present modification, the pressing force caused by the operation of the driver is applied directly to the force sensors 51. Thus, high-accuracy detection is possible. In addition, the number of components is small, and thus a vehicle input device having excellent stability can be provided.

In the second modification of the embodiment of the present invention, the structure is provided in which each force sensor 51 is retained directly by the recess 83a of the casing 83. However, between each force sensor 51 and the recess 83a, a structure may be provided which avoids application of an excessive pressing force to the force sensor 51 when being pressed with the excessive pressing force. Alternatively, each sensor element may be changed to a strain resistance element, an electrostatic sensor, or the like, which is not broken even with an excessive pressing force.

What is claimed is:

1. A vehicle input device comprising:
a mounted portion mounted on a steering apparatus having a steering wheel and a steering column;
an operation input portion provided so as to project from the mounted portion in a direction away from a rotation central axis of the steering wheel and configured to detect an operation of a driver and generate a detection signal; and
a control section configured to receive the detection signal,
wherein the operation input portion has a position detection portion configured to detect a position of a finger operation of the driver and a retaining member configured to retain the position detection portion, the position detection portion provided on a projecting direction end side of the operation input portion, and including
an operation member having a pressing direction far side and a pressing direction near side opposing the pressing direction far side,
a plurality of elastic members elastically supporting the operation member on the retaining member, the plurality of elastic members being disposed at the pressing direction far side of the operation member,
a plurality of pressing members provided at the pressing direction far side of the operation member and attached to the plurality of elastic members, and
a plurality of sensor elements, each of the plurality of sensor elements outputting the detection signal corresponding to a pressing force by the finger operation of the driver, the elastic members being bent by the pressing force by the finger operation of the driver at the pressing direction near side of the operation member so that the operation member is displaced in a pressing direction and the plurality of sensor elements are respectively pressed by the plurality of pressing members,
the detection signal is generated on the basis of the position of the operation with the finger of the driver, wherein the control section continuously determines a change in the position of the finger operation of the driver based on the detection signal from the operation input portion.

2. The vehicle input device according to claim 1, wherein a shape recognizable with a finger of the driver is provided in an end surface of the operation member on the pressing direction near side.

3. The vehicle input device according to claim 1, wherein
the operation input portion has a non-operation position and an operation position at which the operation input portion is tilted toward at least either one of a near side or a far side from the driver by an operation of the driver,
a detection switch configured to detect in which of the non-operation position and the operation position the operation input portion is located is provided, and
a transmission of a vehicle is controllable on the basis of a detection result of the detection switch.

4. The vehicle input device according to claim 1, wherein an end surface of the operation member on the projecting direction end side is located in a position at which the driver is capable of performing an operation with a finger while holding the steering wheel.

5. The vehicle input device according to claim 1, wherein
the steering wheel has a ring portion, and
an end surface of the operation member on the projecting direction end side is shaped along the ring portion.

6. The vehicle input device according to claim 1, further comprising a plurality of operation member retaining springs extending along the pressing direction, wherein the retaining member includes a plurality of spring receiving portions for receiving the plurality of operation member retaining springs.

7. The vehicle input device according to claim 1, wherein the plurality of sensor elements are analog type force sensors, each outputting a detection signal corresponding to the pressing force.

8. The vehicle input device according to claim 1, wherein the operation member defines a plurality of pressing member retaining holes at the pressing direction far side, the plurality of pressing members being inserted in the plurality of pressing member retaining holes.

9. The vehicle input device according to claim 8, wherein the plurality of elastic members are inserted in the plurality of pressing member retaining holes.

* * * * *